(12) United States Patent
Jeong et al.

(10) Patent No.: US 8,455,871 B2
(45) Date of Patent: Jun. 4, 2013

(54) THIN FILM TRANSISTOR ARRAY PANEL AND METHOD FOR MANUFACTURING THE SAME

(75) Inventors: Chang-Oh Jeong, Suwon-si (KR); Woo-Sung Sohn, Seoul (KR); Dong-Gyu Kim, Yongin-si (KR); Shi-Yul Kim, Yongin-si (KR); Ki-Yeup Lee, Yongin-si (KR); Jean-Ho Song, Yongin-si (KR)

(73) Assignee: Samsung Display Co., Ltd., Yongin (KR)

( * ) Notice: Subject to any disclaimer, the term of this patent is extended or adjusted under 35 U.S.C. 154(b) by 99 days.

(21) Appl. No.: 12/859,792

(22) Filed: Aug. 20, 2010

(65) Prior Publication Data
US 2011/0140111 A1    Jun. 16, 2011

(30) Foreign Application Priority Data
Dec. 15, 2009   (KR) .................. 10-2009-0124494

(51) Int. Cl.
*H01L 29/04* (2006.01)
(52) U.S. Cl.
USPC .................................... 257/59; 257/E21.414

(58) Field of Classification Search
USPC ............ 257/59, E21.409, E21.414; 438/158, 438/34
See application file for complete search history.

(56) References Cited

U.S. PATENT DOCUMENTS

| 5,079,178 A | * | 1/1992 | Chouan et al. | 438/161 |
| 5,362,660 A | * | 11/1994 | Kwasnick et al. | 438/158 |
| 2003/0107023 A1 | * | 6/2003 | Chae et al. | 252/79.1 |
| 2008/0001155 A1 | * | 1/2008 | Jung et al. | 257/59 |

* cited by examiner

*Primary Examiner* — Wael Fahmy
*Assistant Examiner* — Sarah Salerno
(74) *Attorney, Agent, or Firm* — H.C. Park & Associates, PLC

(57) ABSTRACT

A thin film transistor array panel is provided and includes a gate line, a gate insulating layer covering the gate line, a semiconductor layer disposed on the gate insulating layer, and a data line and a drain electrode disposed on the semiconductor layer. The data line and the drain electrode have a dual-layered structure including a lower layer and an upper layer with the lower layer having a first portion protruded outside the upper layer and the semiconductor layer having a second portion protruded outside the edge of the lower layer.

11 Claims, 8 Drawing Sheets

THIN FILM TRANSISTOR ARRAY PANEL AND METHOD FOR MANUFACTURING THE SAME

CROSS REFERENCE TO RELATED APPLICATION

This application claims priority to and the benefit of Korean Patent Application No. 10-2009-0124494, filed on Dec. 15, 2009, which is hereby incorporated by reference for all purposes as if fully set forth herein.

BACKGROUND OF THE INVENTION

1. Field of the Invention

Exemplary Embodiments of the present invention relate to a thin film transistor array panel and a manufacturing method thereof.

2. Discussion of the Background

Generally, a thin film transistor (TFT) array panel is used as a circuit board for independently driving pixels in a liquid crystal display or an organic electro-luminescent (EL) display device. The thin film transistor array panel includes a scanning signal line or a gate line transmitting a scanning signal, an image signal line or a data line transmitting an image signal, a thin film transistor connected to the gate line and the data line, and a pixel electrode connected to the thin film transistor.

The thin film transistor includes a gate electrode that is a portion of the gate wire, a semiconductor layer forming a channel, a source electrode that is a portion of the data wire, and a drain electrode. The thin film transistor is a switching element controlling an image signal transmitted to the pixel electrode through the data wire according to the scanning signal transmitted through the gate line.

To reduce the number of processes using a mask when forming the thin film transistor array panel, the data line and the semiconductor layer may be formed by using one mask. That is, the side wall of the data line and the side wall of the semiconductor layer accord with each other. However, when etching the metal of the data line layer, the side wall of the data line and the side wall of the semiconductor layer do not accord with each other due to the increase of a skew, which may result in protrusion of the semiconductor layer from the data line.

As a four-mask structure is introduced in a process to simplify TFT-LCD panel production and reduce cost, screen display deterioration (i.e., a waterfall) may chronically occur. The waterfall problem occurs because the semiconductor layer exposed outside the data wire acts as a conductor when a backlight is turned on such that the semiconductor layer forms a capacitive structure with the pixel electrode, thereby creating vertical lines that continuously flow from the top to the bottom of the display under modulation of the backlight.

The above information disclosed in this section is to enhance understanding of the background of the invention, and it may contain information not part of the prior art already known in this country to a person of ordinary skill in the art.

SUMMARY OF THE INVENTION

Exemplary embodiments of the present invention provide for minimizing a protrusion of the side wall of the semiconductor layer from the side wall of the data line to prevent screen deterioration.

Additional features of the invention will be set forth in the description which follows, and in part will be apparent from the description, or may be learned by practice of the invention.

An exemplary embodiment of the present invention discloses a thin film transistor array panel comprising a gate line, a gate insulating layer covering the gate line, a semiconductor layer disposed on the gate insulating layer, and a data line and a drain electrode disposed on the semiconductor layer. The data line and the drain electrode each comprise a dual-layered structure comprising a lower layer and an upper layer, and the lower layer comprises a first portion protruded outside the edge of the upper layer. The semiconductor layer comprises a second portion protruded outside the edge of the lower layer.

An exemplary embodiment of the present invention also discloses a method for manufacturing a thin film transistor array panel that comprises forming a gate line comprising a gate electrode on an insulation substrate, forming a gate insulating layer covering the gate line, sequentially depositing an amorphous silicon layer, a first metal layer, and a second metal layer on the gate insulating layer, forming a first photosensitive film pattern comprising a first region and a second region, the second region being thicker than the first region on the second metal layer, etching the second metal layer and the first metal layer together by using the first photosensitive film pattern as a mask, etching the amorphous silicon layer by using the first photosensitive film pattern as a mask, executing an etch-back for the first photosensitive film pattern to form a second photosensitive film pattern, wet-etching the second metal layer by using the second photosensitive film pattern as a mask to form an upper layer of a data line and a drain electrode, dry-etching the first metal layer by using the second photosensitive film pattern as a mask to form a lower layer of the data line and the drain electrode, and dry-etching the amorphous silicon layer by using the second photosensitive film pattern as a mask to form a semiconductor layer. Each lower layer comprises a first portion protruded outside the edge of the upper layer, and the semiconductor layer comprises a second portion protruded outside the edge of the lower layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
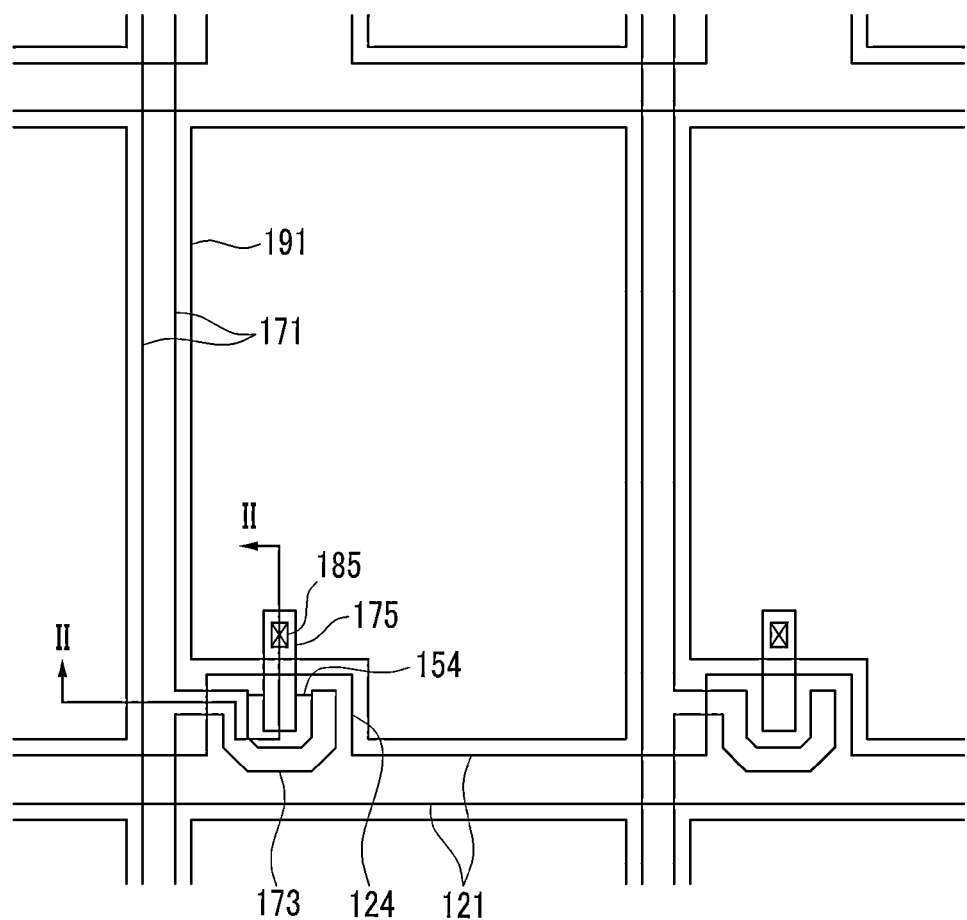
FIG. 1 is a layout view of one pixel of a thin film transistor array panel according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

Figure 2:
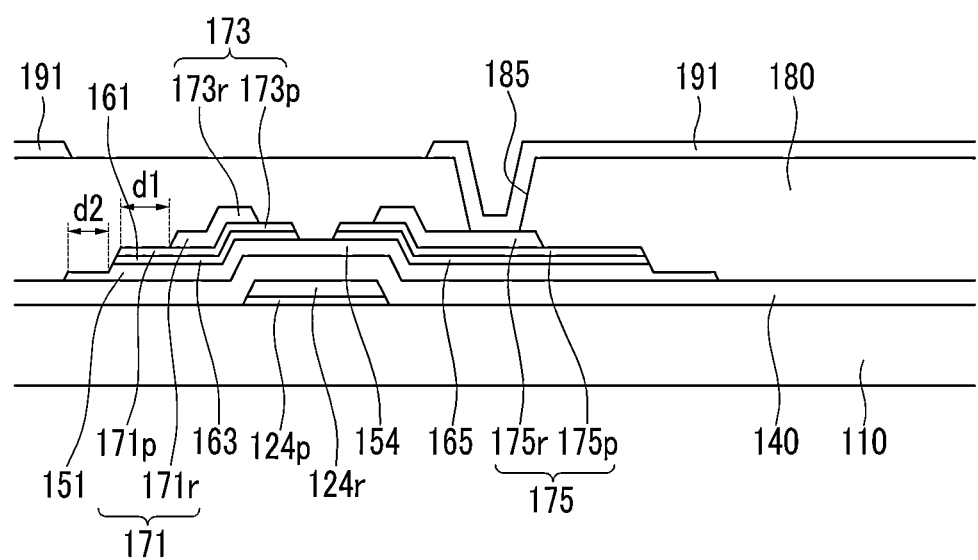
FIG. 2 is a cross-sectional view taken along the line II-II of FIG. 1.

FIG. 1 is a layout view of one pixel of a thin film transistor array panel according to an exemplary embodiment of the present invention. FIG. 2 is a cross-sectional view taken along line II-II shown in FIG. 1.

Referring to FIG. 1 and FIG. 2, a plurality of gate lines 121 are formed on an insulation substrate 110, which may be made of a transparent material such as glass or plastic.

The gate lines 121 transfer a gate signal and extend in a substantially transverse direction. Each gate line 121 includes a plurality of gate electrodes 124 that protrude from the gate lines 121.

The gate lines 121 may have a dual-layer structure that includes a lower layer and an upper layer. Similarly, the gate electrodes 124 may also have a dual-layer structure that includes lower layers 124p and upper layers 124r. The lower layer of the gate lines 121 and the gate electrode lower layer 124p may be made of titanium (Ti) or a titanium alloy. The gate line upper layer and the gate electrode upper layer 124r may be made of copper (Cu) or a copper alloy.

A gate insulating layer 140 is formed on the gate lines 121. The gate insulating layer 140 may be made of an insulating material such as silicon nitride.

A plurality of semiconductor layers 151, which may be made of hydrogenated amorphous silicon or polysilicon, is formed on the gate insulating layer 140. The semiconductor layers 151 include a plurality of protrusions 154 that extend substantially in a longitudinal direction toward the gate electrodes 124.

A plurality of ohmic contact stripes 161 and islands 165 are formed on the protrusions 154 of the semiconductor layers 151. Each ohmic contact stripe 161 has a plurality of projections 163, and a projection 163 and an ohmic contact island 165 are formed in pairs and disposed on a projection 154 of the semiconductor stripe 151.

A plurality of data lines 171 and a plurality of drain electrodes 175 are formed on the ohmic contact stripe 161, the ohmic contact island 165, and the gate insulating layer 140.

The data lines 171 transfer a data voltage and extend in a vertical direction to cross the gate lines 121. Each data line 171 includes a plurality of source electrodes 173 that extend toward the gate electrodes 124 and bend in a U-shape.

The drain electrodes 175 are separated from the data lines 171 and extend upwardly from the center of the U shape of the source electrode 173.

The data lines 171, which include the source electrodes 173 and the drain electrodes 175, may have a dual-layer structure that include respective upper layers 171r, 173r, and 175r and respective lower layers 171p, 173p, and 175p. The data lines 171, source electrodes 173, and drain electrodes 175 may be made of various conductive materials. For example, the upper layers 171r, 173r, and 175r may be made of copper (Cu) or copper alloys, and the lower layers 171p, 173p, and 175p may be made of one material of titanium (Ti), tantalum (Ta), molybdenum (Mo), and alloys thereof.

The widths of the upper layers 171r, 173r, and 175r are narrower than the corresponding widths of the lower layers 171p, 173p, and 175p such that the lower layers 171p, 173p, and 175p partially protrude outside of the edges of the respective upper layers 171r, 173r, and 175r. According to an exemplary embodiment of the present invention, the protruded widths d1 of the lower layers 171p, 173p, and 175p range from 0.01 μm to 0.5 μm.

The horizontal edge of the semiconductor layer 151 disposed under the data line 171 extends in the longitudinal direction and protrudes from the horizontal edge of the lower layer 171p. Here, the semiconductor layer 151 is wider than the lower layer 171p such that the width d2 of the semiconductor layer 151 that protrudes from the horizontal edge of the lower layer 171p ranges from 0.01 μm to 0.5 μm. The portion of the semiconductor layer 151 protruding outside of the horizontal edge of the lower layer 171p is thinner than the portion of the semiconductor layer 151 that is covered by the lower layer 171p.

The horizontal edge of the upper layer 171r, the lower layer 171p, and the semiconductor layer 151 may have a step shape. That is, the portion of the upper surface of the semiconductor layer 151 protruded with reference to the horizontal edge of the upper layer 171r is covered by the lower layer 171p.

The lower layers 171p, 173p, and 175p and the upper layers 171r, 173r, and 175r of the data lines 171, source electrodes 173, and drain electrodes 175 may have tapered side surfaces.

The ohmic contact stripe 161 and the ohmic contact island 165 exist between the underlying semiconductor stripes 151 and the lower layers 171p, 173p, and 175p of the overlying data lines 171, the source electrodes 173, and the drain electrodes 175 to lower contact resistance therebetween. Also, the ohmic contacts 161, 163, and 165 have substantially the same planar shape as the lower layers 171p, 173p, and 175p of the data lines 171 and the drain electrodes 175.

The protrusion 154 of the semiconductor layer 151 has a portion that is not covered by the data line 171 and the drain electrode 175 as well as a portion disposed between the source electrodes 173 and the drain electrodes 175. The semiconductor layer 151 except for the protrusions 154 has substantially the same planar shape as the ohmic contacts 161 and 165.

One gate electrode 124, one source electrode 173, and one drain electrode 175 form a thin film transistor (TFT) along with a protrusion 154 of the semiconductor layer 151, and the channel of the thin film transistor is formed in the protrusion 154 between the source electrode 173 and the drain electrode 175.

A passivation layer 180 is formed on the data lines 171, the source electrodes 173, the drain electrodes 175, and the exposed portions of the semiconductor stripes 151. The passivation layer 180 may be made of an inorganic insulator such as silicon nitride or silicon oxide, an organic insulator, or an insulator having a low dielectric constant.

The passivation layer 180 directly covers the upper surface of the lower layers 171p, 173p, and 175p that protrude outside the edge of the upper layers 171r, 173r, and 175r and the upper surface of the semiconductor layer 151 that protrudes outside the horizontal edge of the lower layers 171p, 173p, and 175p.

The passivation layer 180 has a plurality of contact holes 185 exposing the drain electrodes 175.

A plurality of pixel electrodes 191 are formed on the passivation layer 180. The pixel electrodes 191 are physically and electrically connected to the drain electrodes 175 through the contact holes 185 to receive the data voltages from the drain electrodes 175. The pixel electrodes 191 to which a data voltage is applied and a common electrode (not shown and which may be formed in an opposite display panel or in a thin film transistor array panel) that receives a common voltage generate an electric field, thereby determining a direction of liquid crystal molecules of a liquid crystal layer disposed between the two electrodes. The pixel electrodes 191 and the common electrode form a capacitor (hereinafter referred to as a "liquid crystal capacitor") so that an applied voltage is sustained after the thin film transistor is turned off.

The pixel electrode 191 and a storage electrode line (not shown) overlap each other, thereby forming a storage capacitor that enhances the capacity for maintaining the voltage of the liquid crystal capacitor.

The pixel electrode 191 may be made of a transparent conductor such as indium tin oxide (ITO) or indium zinc oxide (IZO).

FIG. 3, FIG. 4, FIG. 5, FIG. 6, FIG. 7, FIG. 8, FIG. 9, FIG. 10, and FIG. 11 are views taken along the line II-II of FIG. 1 that show a manufacturing method of a thin film transistor array panel according to an exemplary embodiment of the present invention.

Figure 3:
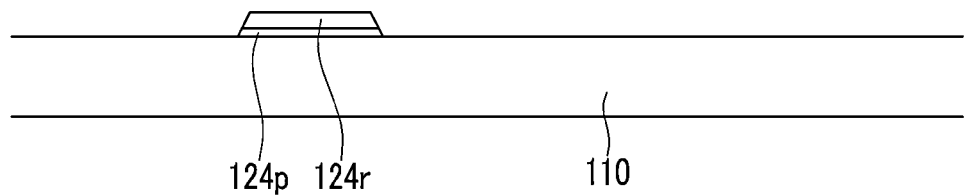
FIG. 3, FIG. 4, FIG. 5, FIG. 6, FIG. 7, FIG. 8, FIG. 9, FIG. 10, and FIG. 11 are views taken along line II-II of FIG. 1 that show a manufacturing method of a thin film transistor array panel according to an exemplary embodiment of the present invention.

Referring to FIG. 3, titanium (Ti) or a titanium alloy may be deposited on an insulation substrate 110 that may be made of a transparent material such as glass or plastic, and then copper (Cu) or a copper alloy may be deposited thereon to form two layers. The two layers are patterned to form a gate line 121 that includes a gate electrode 124.

Specifically, a photosensitive film (not shown) is deposited and patterned, and the gate line lower layer, the gate electrode lower layer 124p, the gate line upper layer, and the gate electrode upper layer 124r are etched by using the patterned photosensitive film (not shown) as a mask. Here, an etchant may etch these layers together.

Figure 4:
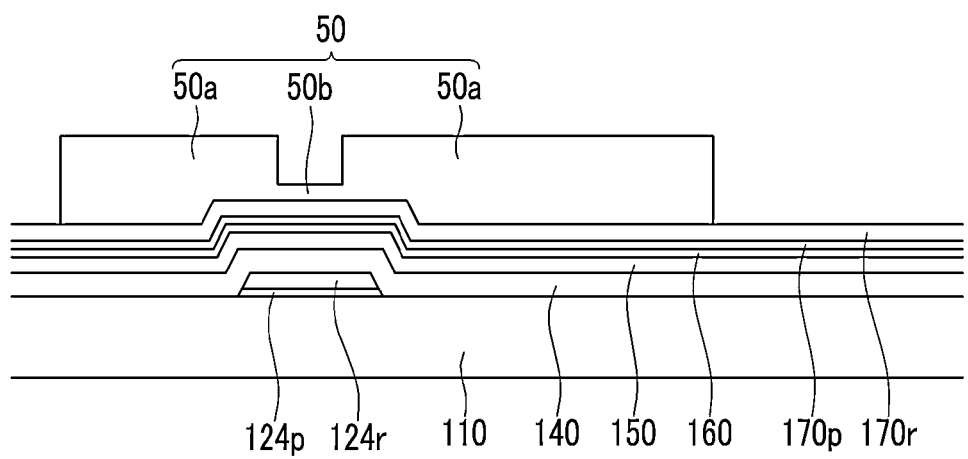

Referring to FIG. 4, a gate insulating layer 140, a first amorphous silicon layer 150, a second amorphous silicon layer 160, a first metal layer 170p, and a second metal layer 170r are sequentially deposited on the gate lines 121 and the gate electrodes 124.

The first amorphous silicon layer 150 may not include impurities. The second amorphous silicon layer 160 may be doped with a conductive impurity, and the first metal layer 170p may be made of one material of titanium (Ti), tantalum (Ta), molybdenum (Mo), and alloys thereof. Additionally, the second metal layer 170r may be made of copper or a copper alloy.

Next, a photosensitive film (photoresist) is formed and patterned to form a first photosensitive film pattern 50. The first photosensitive film pattern 50 has a first region 50a and a second region 50b. The first region 50a is thicker than the second region 50b. The thickness difference of the regions of the first photosensitive film pattern 50 may be formed by controlling the transmittance of the mask or using a reflowing method. When controlling the transmittance of the light, the mask may include a slit pattern, a lattice pattern, or a semi-transparent layer. The second region 50b corresponds to the position where the channel of the thin film transistor will be formed later.

Figure 5:
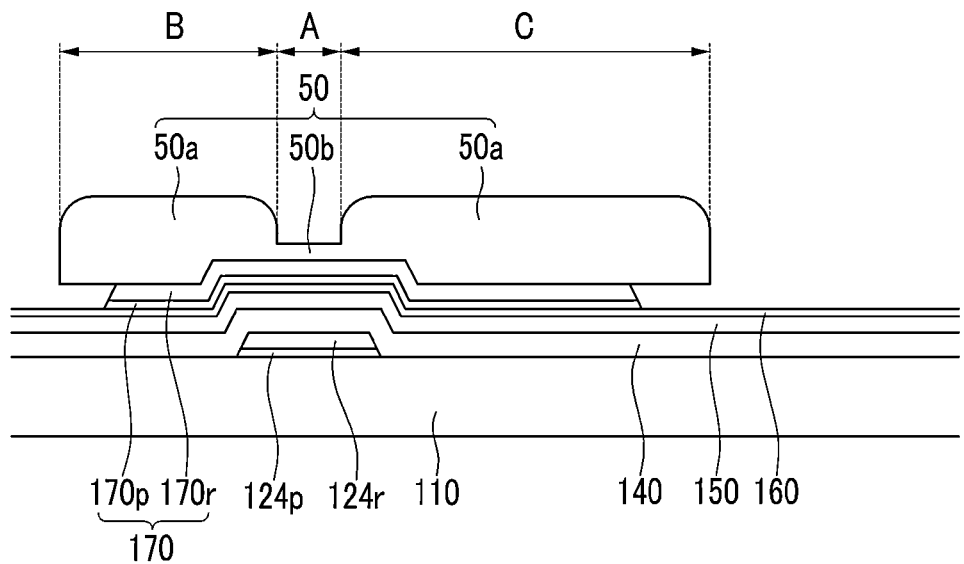

Referring to FIG. 5, the first metal layer 170p and the second metal layer 170r are etched by using the first photosensitive film pattern 50 as a mask and an etchant capable of etching the first metal layer 170p and the second metal layer 170r. Here, the etchant used may be the same as the etchant for etching the lower layers 121p and 124p and the upper layers 121r and 124r of the gate lines 121.

As shown in FIG. 5, if the first metal layer 170p and the second metal layer 170r are etched, the side surface of the first metal layer 170p and the second metal layer 170r that are covered by the first photosensitive film pattern 50 are etched by the etchant, and as a result, as shown in FIG. 5, the boundary lines of the first metal layer 170p and the second metal layer 170r are disposed inside the regions A, B, and C where the first photosensitive film pattern 50 is formed.

Here, the etchant for the first metal layer 170p and the second metal layer 170r does not etch the gate insulating layer 140, the first amorphous silicon layer 150, or the second amorphous silicon layer 160.

Figure 6:
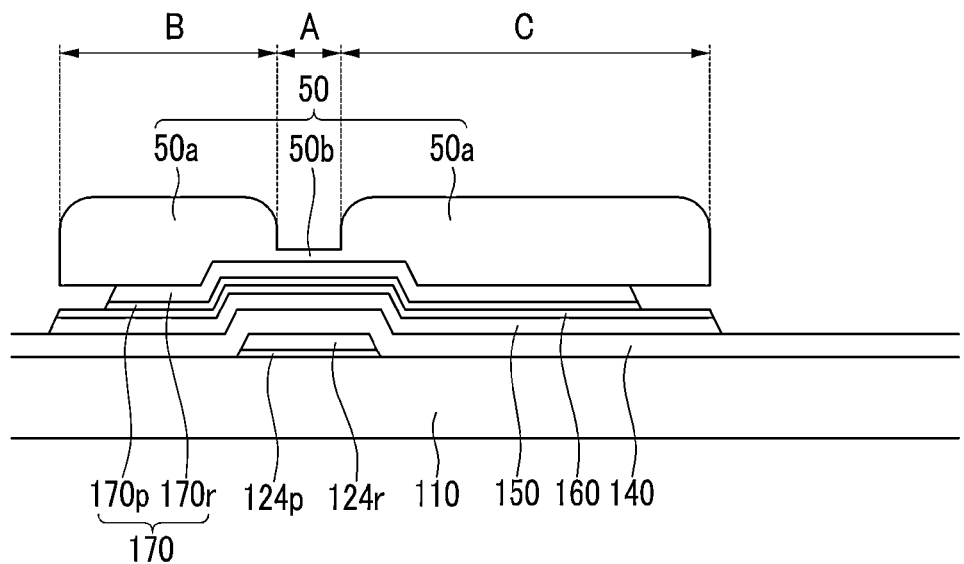

Referring to FIG. 6, the first amorphous silicon layer 150 and the second amorphous silicon layer 160 are etched by using the first photosensitive film pattern 50 as a mask.

Figure 7:
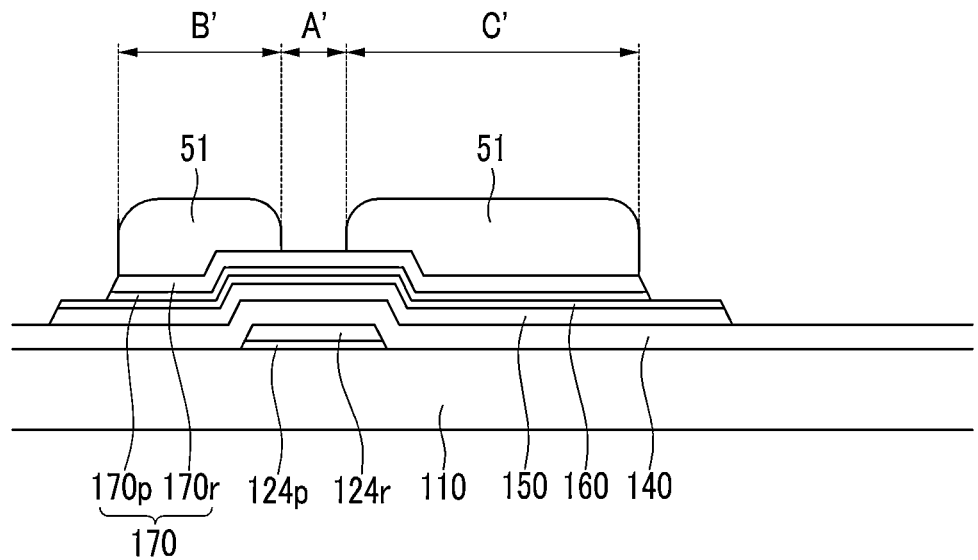

Referring to FIG. 7, an etch back process is executed to remove the second region 50b having the thin thickness. Here, the width and the height of the first region 50a may also be reduced such that the second photosensitive film pattern 51 of FIG. 7 is formed. The second photosensitive film pattern 51 occupies narrower regions A', B', and C' than the regions A, B, and C where the first photosensitive film pattern 50 is formed in FIG. 5 and FIG. 6.

Figure 8:
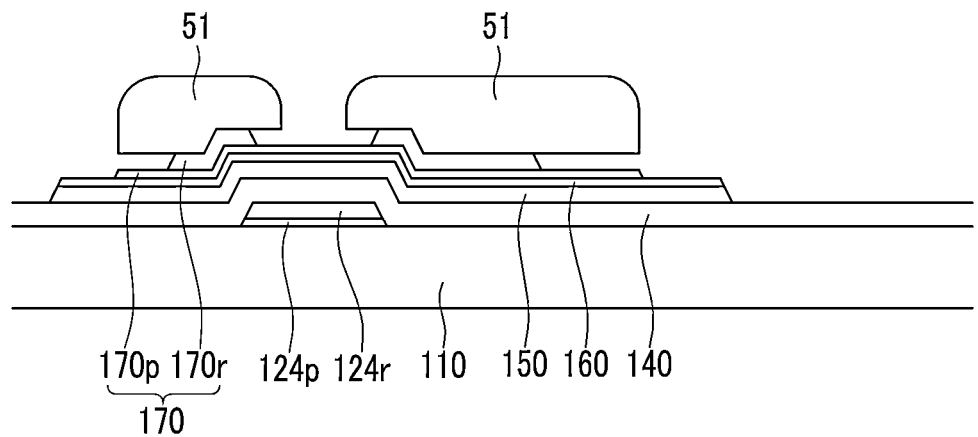

Referring to FIG. 8, the second metal layer 170r may be wet-etched by an enchant while using the second photosensitive film pattern 51 as a mask. Here, the etchant may be different from the etchant used in FIG. 3 and FIG. 5.

The upper surface of the first metal layer 170p may be exposed through the process of FIG. 8. The width of the exposed portion of the first metal layer 170p ranges from 0.01 μm to 0.5 μm.

Figure 9:
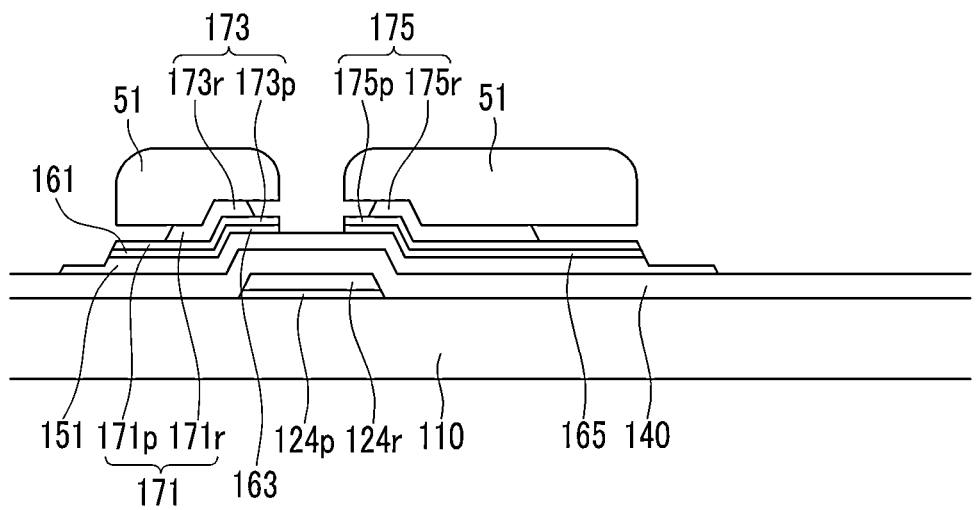

Next, referring to FIG. 9, the first metal layer 170p, the second amorphous silicon layer 160, and the first amorphous silicon layer 150 are dry-etched by using the second photosensitive film pattern 51 as a mask. Due to the etching process, a portion of the first metal layer 170p is removed, thereby forming the data line 171, the source electrode 173, and the drain electrode 175 with two layers. The upper surfaces of the lower layers 171p, 173p, and 175p have distal regions that are exposed.

The second amorphous silicon layer 160 and the first amorphous silicon layer 150 that are not covered by the second photosensitive film pattern 51 are also etched. The second amorphous silicon layer 160 is etched and divided, thereby forming the ohmic contact stripe 161 and the ohmic contact island 165 while exposing the protrusion 154 of the semiconductor layer 151 that acts as the channel of the thin film transistor.

While etching the portion of the first amorphous silicon layer 150 that is disposed under the data line 171 and that extends in the longitudinal direction, portions of the semiconductor layer 151 are also etched to form the first portion that is not covered by the second photosensitive film pattern 51 and disposed outside the gate electrode 124 while conserving the thickness of the second portion that is covered by the second photosensitive film pattern 51. The resulting second portion is thicker than the first portion. Here, the horizontal edge of the first portion of the semiconductor layer 151 is protruded from the horizontal edge of the lower layer 171p such that the upper surface of the first portion of the semiconductor layer 151 is exposed outside of the lower layer 171p. The width of the exposed portion of the first portion of the semiconductor layer 151 ranges from 0.01 μm to 0.5 μm.

As described above, when using the photosensitive film pattern 50 having the different thickness portions 50a and 50b, the lower layers 171p, 173p, and 175p of the data line 171, the source electrode 173, and the drain electrode 175 have the same planar pattern as the ohmic contacts 161, 163, and 165. On the other hand, the thicker portions of semiconductor layers 151 and 154 except for the exposed portion between the drain electrode 175 and the source electrode 173 have substantially the same planar pattern as the lower layers 171p, 173p, and 175p of the data line 171, the source electrode 173, and the drain electrode 175.

Figure 10:
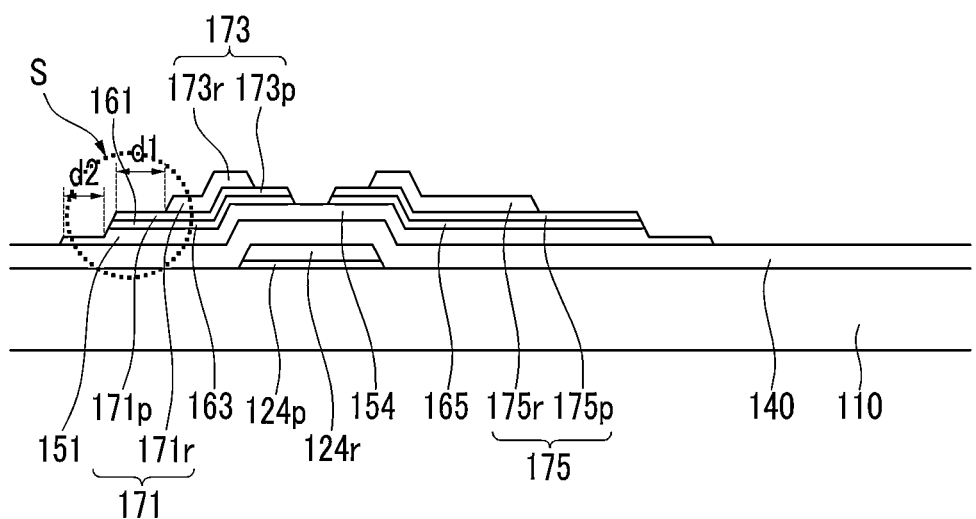

Next, referring to FIG. 10, an ashing process is executed to remove a photosensitive film pattern 51. As shown in FIG. 10, the width d1 of the exposed portion of the lower layer 171p having the wider width than the upper layer 171r ranges from 0.01 μm to 0.5 μm, and the width d2 of the exposed portion of the semiconductor layer 151 having the wider width than the lower layer 171p ranges from 0.01 μm to 0.5 μm. In FIG. 10, referring to the region indicated by "S," the horizontal edge of the upper layer 171r, the lower layer 171p, and the semiconductor layer 151 have a step shape.

Figure 11:
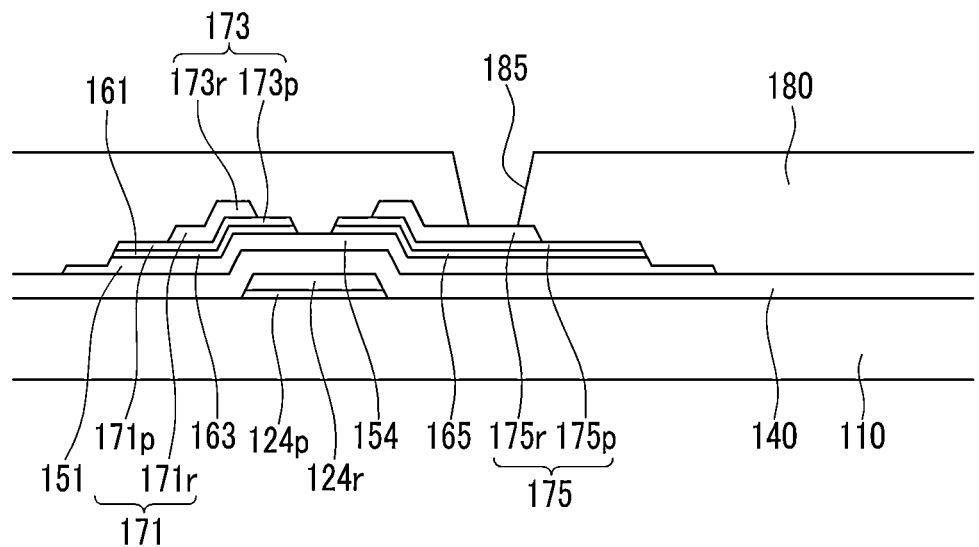

Next, referring to FIG. 11, a passivation layer 180, which may be made of an organic or an inorganic material, is formed and patterned by using a photosensitive film to form a contact hole 185 that exposes the upper layer 175r of the drain electrode 175.

Next, as shown in FIG. 2, a transparent conductor such as ITO or IZO is deposited and patterned to form a pixel electrode 191 connected to the exposed drain electrode 175.

Figure 12:
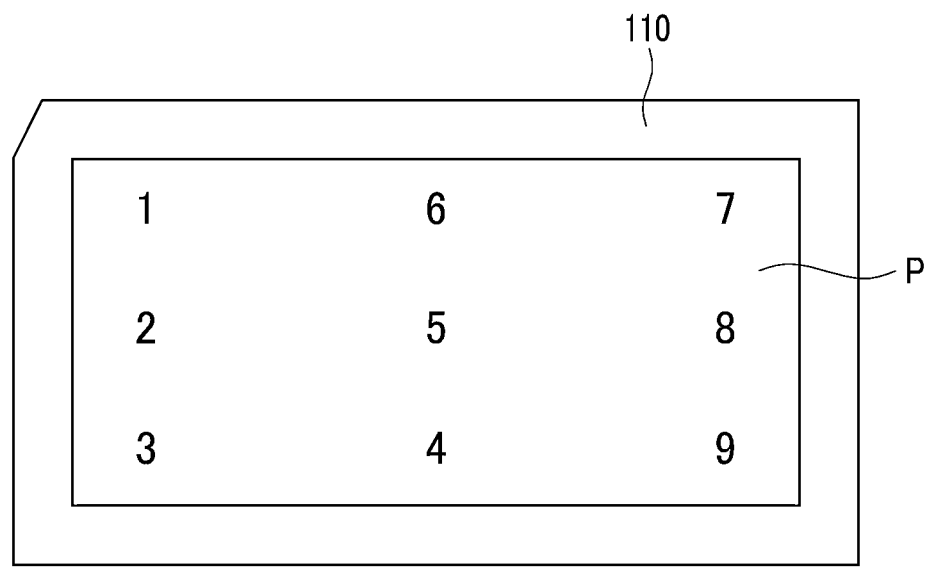
FIG. 12 is a top plan view of a thin film transistor array panel according to an exemplary embodiment of the present invention.
Figure 13:
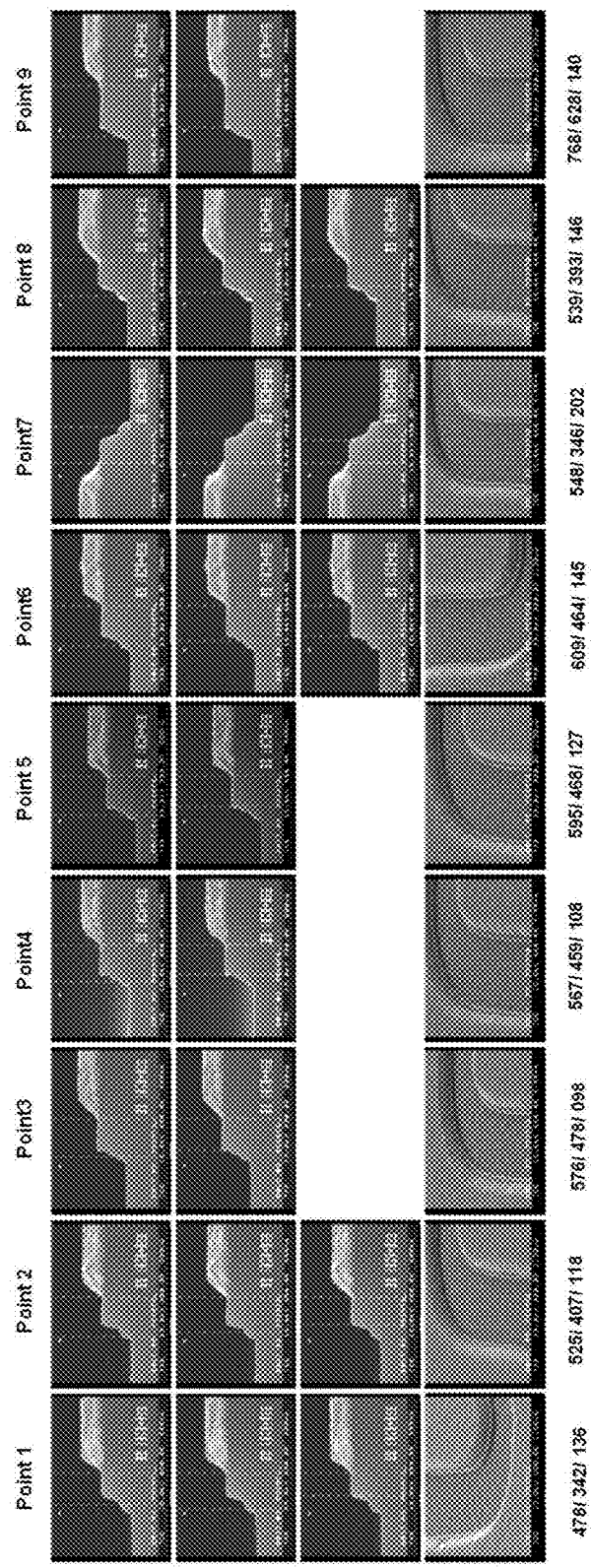
FIG. 13 shows photographs of cross-sections of each of the first region to the ninth region shown in FIG. 12.

FIG. 12 is a top plan view of a thin film transistor array panel according to an exemplary embodiment of the present invention. FIG. 13 shows photographs of cross-sections of each of the first region, second region, third region, fourth region, fifth region, sixth region, seventh region, eighth region, and ninth region shown in FIG. 12.

Referring to FIG. 12, a display area P that includes the first region, second region, third region, fourth region, fifth region, sixth region, seventh region, eighth region, and ninth region indicated by "1" to "9," respectively, is formed on an insulation substrate 110. FIG. 13 shows scanning electron microscope (SEM) photographs respectively taken in the first to ninth regions. Three values disposed under each photo are the distance from the horizontal edge of the upper layer 171r to the horizontal edge of the protruded semiconductor layer 151, the distance from the horizontal edge of the upper layer 171r to the protruded lower layer 171p, and the distance from the horizontal edge of the lower layer 171p to the horizontal edge of the protruded semiconductor layer 151.

Calculated averages for the measured values are as follow: the distance from the horizontal edge of the upper layer 171r to the horizontal edge of the protruded semiconductor layer 151 is 578 nm; the distance from the horizontal edge of the upper layer 171r to the protruded lower layer 171p is 443 nm; and the distance from the horizontal edge of the lower layer 171p to the horizontal edge of the protruded semiconductor layer 151 is 135 nm.

According to an exemplary embodiment of the present invention, the thin film transistor array panel may be manufactured in which the distance from the horizontal edge of the upper layer 171r to the horizontal edge of the protruded semiconductor layer 151 may range from 334 nm to 822 nm; the distance from the horizontal edge of the upper layer 171r to the protruded lower layer 171p may range from 183 nm to 703 nm; and the distance from the horizontal edge of the lower layer 171p to the horizontal edge of the protruded semiconductor layer 151 may range from 45 nm to 225 nm.

When reviewing the measured values of the thin film transistor array panel according to an exemplary embodiment of the present invention, the width of the protruded portion of the lower layer of the data line and the protruded portion of the semiconductor layer may range from 0.01 μm to 0.5 μm. When the backlight of the liquid crystal display is turned on, the protruded portion of the semiconductor layer may act as a conductor. Here, capacitance may be generated between the conductor of the protrusion of the semiconductor layer and the pixel electrode such that deterioration of the display may occur. However, in an exemplary embodiment of the present invention, the width of the protruded portion of the lower layer of the data line and the protruded portion of the semiconductor layer may range from 0.01 μm to 0.5 μm such that the screen deterioration may not be generated. Particularly, when the backlight is turned on or turned off, the protruded portion of the lower layer of the data line is always a conductor such that it does not contribute to the screen deterioration, and the protruded portion of the semiconductor layer may be substantially reduced such that the screen deterioration may be prevented.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for manufacturing a thin film transistor array panel, comprising:
    forming a gate line comprising a gate electrode on a substrate;
    forming a gate insulating layer on the gate line;
    sequentially depositing an amorphous silicon layer, a first metal layer, and a second metal layer on the gate insulating layer;
    forming a first photosensitive film pattern on the second metal layer, the first photosensitive film pattern comprising a first region and a second region thicker than the first region;
    etching the second metal layer and the first metal layer using the first photosensitive film pattern as a mask;
    etching the amorphous silicon layer using the first photosensitive film pattern as a mask;
    etching the first photosensitive film pattern to form a second photosensitive film pattern;
    wet-etching the second metal layer using the second photosensitive film pattern as a mask to form an upper layer of a data line and a drain electrode;
    dry-etching the first metal layer using the second photosensitive film pattern as a mask to form a lower layer of the data line and the drain electrode; and
    dry-etching the amorphous silicon layer using the second photosensitive film pattern as a mask to form a semiconductor layer,
    wherein each lower layer comprises a first portion that protrudes outside an edge of the upper layer, and the semiconductor layer comprises a second portion that protrudes outside an edge of the lower layer, and
    wherein the lower layer comprises one of titanium, tantalum, molybdenum, and alloys thereof.

2. The method of claim 1, wherein a width of first portion ranges from 0.01 μm to 0.5 μm, and a width of the second portion ranges from 0.01 μm to 0.5 μm.

3. The method of claim 2, wherein the upper layer comprises copper or copper alloy.

4. The method of claim 3, wherein after the dry-etching of the first metal layer and the amorphous silicon layer, the second portion of the semiconductor layer is thinner than a portion of the semiconductor layer covered by the lower layer.

5. The method of claim 4, wherein the amorphous silicon layer comprises a first amorphous silicon layer that does not include an impurity and a second amorphous silicon layer disposed on the first amorphous silicon layer and comprising an impurity dopant;
the first amorphous silicon layer is etched to form a semiconductor layer of a channel of a thin film transistor; and
the second amorphous silicon layer is etched to form an ohmic contact layer.

6. The method of claim 5, further comprising:
forming a passivation layer comprising a contact hole exposing a portion of one of a source electrode and the drain electrode after removing the second photosensitive film pattern; and
forming a pixel electrode on the passivation layer, the pixel electrode being connected to the one of the source electrode and the drain electrode through the contact hole.

7. The method of claim 6, wherein an upper surface of the first portion and an upper surface of the second portion directly contact the passivation layer.

8. The method of claim 1, wherein the gate line comprises a lower layer comprising titanium and an upper layer comprising copper.

9. The method of claim 1, wherein the second metal layer and the first metal layer are wet etched.

10. The method of claim 1, wherein after dry-etching of the first metal layer and the amorphous silicon layer, the second portion of the semiconductor layer is thinner than a portion of the semiconductor layer covered by the lower layer.

11. The method of claim 10, further comprising:
forming a passivation layer on the data line and the drain electrode and comprising a contact hole exposing a portion of the drain electrode after removing the second photosensitive film pattern; and
forming a pixel electrode on the passivation layer and electrically connected to the drain electrode through the contact hole,
wherein the upper layer comprises copper or a copper alloy, the amorphous silicon layer comprises a first amorphous silicon layer that does not include an impurity and a second amorphous silicon layer disposed on the first amorphous silicon layer that comprises an impurity dopant, the first amorphous silicon layer is etched to form a semiconductor layer of a channel of a thin film transistor, the second amorphous silicon layer is etched to form an ohmic contact layer, and an upper surface of the first portion and an upper surface of the second portion directly contact the passivation layer.

* * * * *